US012456970B2

(12) United States Patent
Trentin et al.

(10) Patent No.: US 12,456,970 B2
(45) Date of Patent: Oct. 28, 2025

(54) POWER CONTROL CIRCUIT FOR MANAGING POWER DELIVERED TO A LOAD BASED ON A CONTROL SIGNAL AND A CURRENT SENSOR SIGNAL

(71) Applicant: Infineon Technologies AG, Neubiberg (DE)

(72) Inventors: Alberto Trentin, Telve di Sopra (IT); Fausto Borghetti, Sant'Ambrogiodi Valpolicella (IT)

(73) Assignee: Infineon Technologies AG, Neubiberg (DE)

( * ) Notice: Subject to any disclaimer, the term of this patent is extended or adjusted under 35 U.S.C. 154(b) by 98 days.

(21) Appl. No.: 18/482,622

(22) Filed: Oct. 6, 2023

(65) Prior Publication Data

US 2025/0119133 A1    Apr. 10, 2025

(51) Int. Cl.
*H03K 17/042*    (2006.01)
*H03K 17/06*    (2006.01)
*H03K 17/687*    (2006.01)

(52) U.S. Cl.
CPC ..... *H03K 17/04206* (2013.01); *H03K 17/063* (2013.01); *H03K 17/687* (2013.01)

(58) Field of Classification Search
CPC .......... H03K 17/04206; H03K 17/063; H03K 17/687; H03K 17/08; H03K 17/082; H03K 17/0822; H02H 3/08; H02H 3/087; H02H 3/105; H02H 3/16; H02H 5/041; H02H 9/00; H02H 9/02; H02H 9/025
See application file for complete search history.

(56) References Cited

U.S. PATENT DOCUMENTS

2008/0175029 A1*   7/2008   Jung ............... H02M 3/156
                                                     363/79

OTHER PUBLICATIONS

"TLD6098-1EP DC-DC boost controller with spread spectrum frequency modulation and with built-in diagnosis and protection features designed for LED drivers.", Retrieved from: https://www.infineon.com/cms/en/product/power/lighting-ics/litix-automotive-led-driver-ic/litix-power/tld6098-1ep/, Accessed on: Jul. 19, 2023, 6 pp.

* cited by examiner

*Primary Examiner* — Jung Kim
(74) *Attorney, Agent, or Firm* — Shumaker & Sieffert, P.A.

(57)    ABSTRACT

A power control circuit includes an input connection, an output connection, and a current sensor configured to generate a power signal corresponding to an electrical signal delivered from a power source to a load. The power control circuit is configured to receive, from a controller via the input connection, a control signal comprising a sequence of control signal pulses occurring at a control signal frequency and generate an output signal based on the power signal, the sequence of control signal pulses, and the control signal frequency. The power control circuit is configured to deliver, via the output connection, the output signal to control a gate driver circuit to manage the power signal delivered from the power source to the load.

18 Claims, 4 Drawing Sheets

POWER CONTROL CIRCUIT FOR MANAGING POWER DELIVERED TO A LOAD BASED ON A CONTROL SIGNAL AND A CURRENT SENSOR SIGNAL

TECHNICAL FIELD

This disclosure relates to circuits for controlling power delivered to a load.

BACKGROUND

Driver circuits are often used to control a voltage, current, or power at a load. For instance, a set of semiconductor devices may be part of one or more circuits that provide an electrical signal to a load. The set of semiconductor devices may be part of power converters, power supply devices, bypass circuits, or other kinds of circuits. Gate driver circuits, in some cases, may control the set of semiconductor devices by delivering electrical signals to respective gate terminals of the set of semiconductor devices. One or more circuits may deliver control signals to cause the gate driver circuits to control the set of semiconductor devices.

SUMMARY

In general, this disclosure is directed to devices, systems, and techniques for managing power delivered to a load based on a power signal generated by a current sensor. For example, a power control circuit may include a current sensor that generates a power signal indicating an amount of power delivered from a power source to a load. The power signal may indicate one or both of a current delivered to the load and a voltage delivered to the load. The power control circuit may receive a control signal from the controller. In some cases, the power control circuit may control the power delivered to the load based on the control signal and the power signal generated by the current sensor.

In some examples, one or more power transistors may be connected to a node between the power source and the load. When the one or more transistors are turned on, at least some current delivered by the power source may flow through the one or more power transistors without flowing to the load. When the one or more transistors are turned off, current may flow from the power source to the load without at least some of the current flowing through the one or more power transistors. The power control circuit manages the power delivered to the load by controlling the one or more power transistors. For example, the power control circuit may sink at least a portion of power away from the load by turning on the one or more power transistors and allow power to flow to the load by turning off the one or more power transistors.

The techniques of this disclosure may provide one or more advantages. For example, the power control circuit may manage the power delivered to the load based on a modulated control signal received from the controller and the power signal generated by the current sensor. The power control circuit may more efficiently control the power delivered to the load as compared with systems that use a controller with mixed signal circuitry to control power delivered to a load. That is, using a power control circuit to manage power delivered to a load may eliminate a need for a controller to include mixed circuitry for processing the power signal generated by the current sensor.

In some examples, a power control circuit includes an input connection, an output connection, and a current sensor configured to sense a power signal delivered from a power source to a load. The power control circuit is configured to receive, from a controller via the input connection, a control signal comprising a sequence of control signal pulses occurring at a control signal frequency and generate an output signal based on the power signal, the sequence of control signal pulses, and the control signal frequency. The power control circuit is also configured to deliver, via the output connection, the output signal to control a gate driver circuit to manage the power signal delivered from the power source to the load.

In some examples, a method includes sensing, by a current sensor of a power control circuit, a power signal delivered from a power source to a load and receiving, by a power control circuit from a controller via an input connection of the power control circuit, a control signal comprising a sequence of control signal pulses occurring at a control signal frequency. The method also includes generating, by the power control circuit, an output signal based on the power signal, the sequence of control signal pulses, and the control signal frequency; and delivering, by the power control circuit via an output connection, the output signal to control a gate driver circuit to manage the power signal delivered from the power source to the load.

In some examples, a system includes a controller, a gate driver circuit, and a power control circuit. The power control circuit includes an input connection, an output connection, and a current sensor configured to sense a power signal delivered from a power source to a load. The power control circuit is configured to receive, from the controller via the input connection, a control signal comprising a sequence of control signal pulses occurring at a control signal frequency, generate an output signal based on the power signal, the sequence of control signal pulses, and the control signal frequency, and deliver, via the output connection, the output signal to control the gate driver circuit to manage the power signal delivered from the power source to the load.

The summary is intended to provide an overview of the subject matter described in this disclosure. It is not intended to provide an exclusive or exhaustive explanation of the systems, devices, and methods described in detail within the accompanying drawings and description below. Further details of one or more examples of this disclosure are set forth in the accompanying drawings and in the description below. Other features, objects, and advantages will be apparent from the description and drawings, and from the claims.

DETAILED DESCRIPTION

Figure 1:
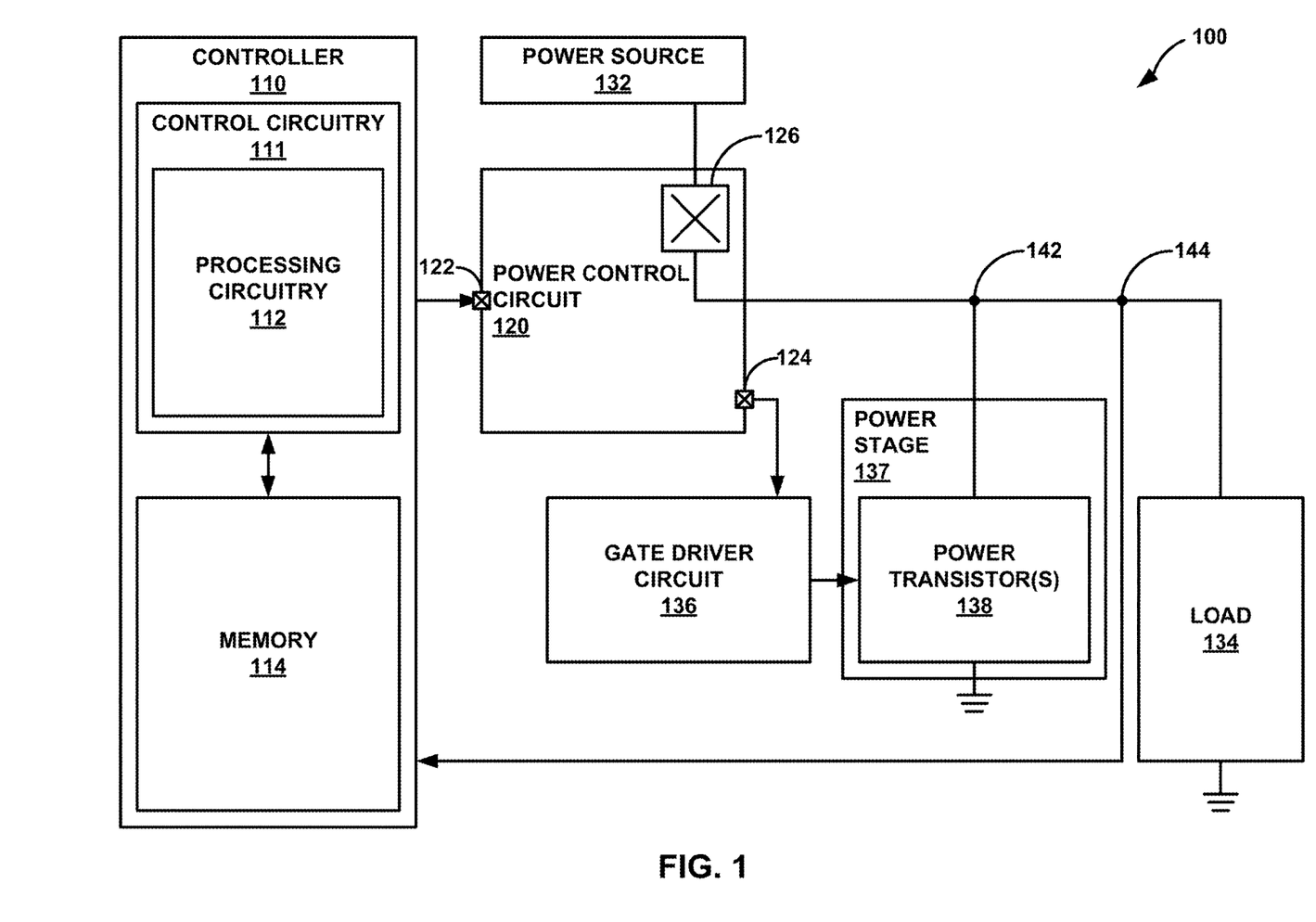
FIG. 1 is a block diagram illustrating a system for controlling power delivered to a load, in accordance with this disclosure.

FIG. 1 is a block diagram illustrating a system 100 for controlling power delivered to a load, in accordance with this disclosure. As seen in FIG. 1, system 100 includes controller 110 including control circuitry 111, processing circuitry 112, and memory 114. System 100 also includes power control circuit 120 including input connection 122, output connection 124, and current sensor 126. System 100 also includes power source 132, load 134, gate driver circuit 136, and power stage 137 including power transistor(s) 138. System 100 also includes node 142 connected to power transistor(s) 138 and node 144 connected to load 134.

Controller 110 may include control circuitry 111. Control circuitry 111 may, in some examples, be configured to control power control circuit 120 to manage power delivered to load 134 by controlling power transistor(s) 138. In some examples, control circuitry 111 may include an analog-to-digital (ADC) converter, other kinds of power converter, a physics processing unit (PPU), a central processing unit (CPU), timer circuitry, or any combination thereof. In some examples, control circuitry 111 may represent a microcontroller unit (MCU). Control circuitry 111 may, in some examples, receive an analog signal from node 144. Control circuitry 111 may convert the analog signal to a digital signal for processing, and output an analog signal to power control circuit 120. In some examples, control circuitry 111 may output a modulated digital signal to power control circuitry.

Control circuitry 111 may include processing circuitry 112. Processing circuitry 112 may include, for example, one or more microprocessors, digital signal processors (DSPs), application specific integrated circuits (ASICs), field-programmable gate arrays (FPGAs), or equivalent discrete or integrated logic circuitry, or a combination of any of the foregoing devices or circuitry. Accordingly, processing circuitry 112 may include any suitable structure, whether in hardware, software, firmware, or any combination thereof, to perform the functions ascribed herein to controller 110.

Controller 110 may include a memory 114 in communication with the processing circuitry 112. In some examples, the memory 114 in communication with processing circuitry 112 includes computer-readable instructions that, when executed by the processing circuitry 112, cause system 100 to perform various functions attributed to first system 100 herein. The memory 114 may include any volatile, non-volatile, magnetic, optical, or electrical media, such as a random-access memory (RAM), read-only memory (ROM), non-volatile RAM (NVRAM), electrically erasable programmable ROM (EEPROM), flash memory, or any other digital media capable of storing information.

Power control circuit 120 may be configured to receive a control signal from controller 110 via input connection 122. In some examples, the control signal may represent a modulated signal including a sequence of control signal pulses occurring at a control signal frequency. In some examples, the modulated signal may include a frequency, a sequence of pulses each including an amplitude, a duty cycle or any combination thereof. In some examples, the control signal received via input connection 122 may represent an analog signal, but this is not required. In some examples, the control signal may represent a modulated digital signal. In some cases, power control circuit 120 may control the power output to load 134 based on the control signal received from controller 110 without receiving any other signals from controller 110. In some cases, power control circuit 120 may control the power output to load 134 based on the control signal and one or more other signals received from controller 110.

In some examples, the control signal received from the controller 110 may represent a single pulse width modulation (PWM) signal driven by timer circuitry of control circuitry 111. A PWM signal may represent a signal that achieves analog results with a digital signal. For example, a PWM signal may comprise a sequence of square pulses, each square pulse of the sequence of square pulses including an amplitude and a duration. In some examples, a PWM signal may include pulses other than square pulses such as triangular pulses. By outputting the control signal including a single PWM signal to power control circuit 120, controller 110 may be configured to act in a closed-loop system where controller 110 does not need to process an analog power signal generated by current sensor 126.

Current sensor 126 may be configured to sense a current output from power source 132. For example, current sensor 126 may generate a power signal that indicates a current of an electrical signal output from power source 132, a voltage of an electrical signal output from power source 132, a magnetic field corresponding to the electrical signal, or any combination thereof. In some examples, current sensor 126 may comprise a Hall effect sensor. A Hall effect sensor is a type of transducer or sensor configured to detect a magnetic field. Hall effect sensors may use the principle of the Hall effect, a phenomenon in which an electric voltage is generated across a conductor or semiconductor when the conductor or semiconductor is subjected to a perpendicular magnetic field and an electric current flows through the conductor or semiconductor. This means that Hall effect may be configured to sense a magnetic field, an electrical current, a voltage, or any combination thereof.

Hall effect sensors may measure current indirectly by detecting a magnetic field generated by a current-carrying conductor. Additionally, or alternatively, Hall effect sensors may measure current by measuring the magnetic field strength near the conductor. Current sensor 126 may include an open-loop Hall effect sensor and/or a closed-loop Hall effect sensor. Open-loop Hall effect sensors may measure current by sensing a magnetic field around a current-carrying conductor. For example, an open-loop Hall effect may be located in proximity to a conductor carrying a current. As current flows through a conductor, it generates a magnetic field around the conductor in accordance with Ampere's law. An Open-loop Hall effect sensor may detect this magnetic field. The open-loop Hall sensor may convert the detected magnetic field into an electrical voltage (e.g., a Hall voltage). The Hall voltage is proportional to the current passing through the conductor and can be determined accordingly. The output voltage of the open-loop Hall sensor may be amplified and processed to obtain a measurement of current through the conductor.

Additionally, or alternatively, current sensor 126 may include a closed-loop Hall effect sensor. Closed-loop Hall effect current sensors may be configured for current measurement and offer high accuracy and linearity. Closed-loop Hall effect current sensors operate based on a feedback mechanism to maintain a constant magnetic field within the sensor. A closed-loop Hall sensor may be placed around a current-carrying conductor. For example, the conductor may pass through a central opening in current sensor 126. A closed-loop Hall sensor may include a magnetic field generator (e.g., a permanent magnet or a current-carrying coil). This internal magnetic field may be maintained at a constant level. When current flows through the conductor, it causes an opposing magnetic field sensed by the closed-loop Hall sensor. The Hall sensor may adjust an output voltage (e.g., a Hall voltage) to nullify an effect of the magnetic field. The Hall voltage required to maintain an internal magnetic field at a constant level is proportional to a current passing through the conductor. The output voltage of the closed-loop Hall sensor may be measured and calibrated to provide a measurement of the current.

Power source 132 is configured to deliver power to load 134. In some examples, power source 132 includes a battery and a power generation circuit to produce operating power. In some examples, power source 132 is rechargeable to allow extended operation. Power source 132 may include any one or more of a plurality of different battery types, such as nickel cadmium batteries and lithium-ion batteries. In some examples, a maximum voltage output of power source 132 is approximately 12V, but this is not necessary. In some examples, a maximum voltage output of power source 132 is greater than 100V (e.g., 400V).

Load 134 may define a collection of electrical components that consume power. In some examples, load 134 includes a collection of circuit components such as resistors, inductors, capacitors, diodes, and other semiconductor elements. Load 134 may include one or more post regulator circuits. In some examples, load 134 includes electric motors and other electric components (e.g., dashboard, control panels, heating/cooling systems, and lights) of a vehicle. Example vehicles include cars, trucks, buses, motorcycles, golf carts, all-terrain vehicles (ATVs), snowmobiles, aircraft, and watercraft. In other examples, load 134 includes electric motors and electric components used in other applications.

Gate driver circuit 136 may control whether each power transistor of power transistor(s) 138 is turned on or turned off. To control the power delivered to load 134, power control circuit 120 may generate an output signal for delivery to gate driver circuit 136 to control whether each power transistor of power transistor(s) 138 is turned on or turned off. For example, a duty cycle of each power transistor of power transistor(s) 138 may determine an amount of current passing through power stage 137 instead of passing through load 134. Power control circuit 120 may control a duty cycle of each power transistor of power transistor(s) 138 by transmitting the output signal to gate driver circuit 136 via output connection 124.

Power stage 137 may be configured to control power delivered from power source 132 to load 134. A power stage may manage delivery of power to a load, such as a motor, an LED, or any other device that requires electrical energy to function. Power stage 137 may regulate voltage and current to ensure that load 134 receives a correct amount of power efficiently and reliably. Power stages may be used in various electronic systems including power supplies, motor control circuits, amplifiers, and voltage regulators. Power stage 137 may, in some examples, include power transistor(s) 138.

Power transistor(s) 138 may represent semiconductor transistor devices or other kinds of switches configured for power delivery. Each power transistor of power transistor(s) 138 may, in some cases, include a power switch such as, but not limited to, any type of field-effect transistor (FET) including any one or combination of a metal-oxide-semiconductor field-effect transistor (MOSFET), a bipolar junction transistor (BJT), an insulated-gate bipolar transistor (IGBT), a junction field effect transistor (JFET), a high electron mobility transistor (HEMT), or other kinds of elements that use voltage or current for control. Additionally, each power transistor of power transistor(s) 138 may include any one or combination of n-type transistors, p-type transistors, and other kinds of power transistors. In some examples, each power transistor of power transistor(s) 138 includes vertical transistors, lateral transistors, and/or horizontal transistors. In some examples, each power transistor of power transistor(s) 138 includes other analog devices such as diodes and/or thyristors. In some examples, each power transistor of power transistor(s) 138 may operate as a switch and/or operate as an analog device.

In some examples, each power transistor of power transistor(s) 138 includes three terminals: two load terminals and a control terminal. When a power transistor represents a MOSFET, the power transistor may include a drain terminal, a source terminal, and at least one gate terminal, where the control terminal is a gate terminal. When a power transistor represents a BJT switch, the control terminal may represent a base terminal. Current may flow between the two load terminals of a power transistor, based on the voltage at the respective control terminal. Therefore, electrical current may flow across the power transistor based on control signals delivered to the control terminal of the power transistor. In one example, if a voltage applied to the control terminal of the power transistor is greater than or equal to a voltage threshold, the power transistor may be activated, allowing the power transistor to conduct electricity. Furthermore, the power transistor may be deactivated when the voltage applied to the control terminal of the power transistor is below the threshold voltage, thus preventing the power transistor from conducting electricity. Power control circuit 120 may be configured to control each of power transistor(s) 138 by transmitting an output signal to gate driver circuit 136 via output connection 124.

Each power transistor of power transistor(s) 138 may include various material compounds, such as Silicon, Silicon Carbide, Gallium Nitride, or any other combination of one or more semiconductor materials. In some examples, silicon carbide switches may experience lower switching power losses. Improvements in magnetics and faster switching, such as Gallium Nitride switches, may allow a power transistor to draw short bursts of current. These higher frequency devices may require control signals (e.g., voltage signals delivered to the control terminal of the power transistor) to be sent with more precise timing, as compared to lower-frequency devices.

In some examples, power transistor(s) 138 may include a single power transistor connected to node 142. In some examples, power transistor(s) 138 may include more than one power transistors. In any case, power transistor(s) 138 may be connected to node 142 such that when power transistor(s) 138 are turned on, at least some current of an electrical signal output from power source 132 may flow through power transistor(s) 138 instead of flowing though load 134. When power transistor(s) 138 are turned off, current of the electrical signal output from power source 132 may travel to load 134 without a portion of the current flowing through power transistor(s) 138.

To generate the output signal, power control circuit 120 may generate the output signal to include a sequence of gate control pulses for controlling power transistor(s) 138. Each gate control pulse of the sequence of gate control pulses may be configured to cause a power transistor of power transistor(s) 138 to turn on and turn off according to a power transistor switching cycle. To deliver the output signal to gate driver circuit 136, the power control circuit 120 is configured to deliver the output signal to the gate driver circuit 136 so that the gate driver circuit 136 controls a gate terminal of power transistor(s) 138 so that power transistor(s) 138 turn off and turn on according to the sequence of gate control pulses.

In some examples, power control circuit 120 includes a signal sum unit. Power control circuit 120 is configured to cause the signal sum unit to receive a first signal sum input based on the power signal from current sensor 126. Power control circuit 120 is configured to cause the signal sum unit to receive a second signal sum input based on the control signal received from the controller 110 via the input connection 122. Power control circuit may generate, using the signal sum unit, a signal sum output based on the first signal sum input and the second signal sum input. The signal sum output may include a sum of the first signal sum input and the second signal sum input. This means that the signal sum unit may combine the control signal received from the controller 110 with the power signal received from the current sensor 126 to generate a combined signal. Power control circuit 120 may generate the output signal transmitted to gated driver circuit 136 based on the signal sum output.

Power control circuit 120 may, in some examples, include a signal ramp unit. Power control circuit 120 may generate, using the signal ramp unit, the second signal sum input for the signal sum unit based on the control signal received via the input connection 122. The second signal sum input may include a sequence of ramp signal pulses corresponding to the sequence of control signal pulses of the control signal occurring at the control signal frequency. This means that the signal sum output may, in some examples, include a ramp signal corresponding to a sum of the second signal sum input and the power signal received from the current sensor 126.

In some examples, the power control circuit 120 may include a comparator. To generate the output signal for transmission to gate driver circuit 136 via output connection 124, power control circuit 120 is configured to cause the comparator to receive a first comparator input and a second comparator input. In some examples, the first comparator input is based on the control signal from controller 110 and the power signal from current sensor 126. In some examples, the second comparator input is based on the control signal from controller 110. Power control circuit 120 may generate, using the comparator, a comparator output based on the first comparator input and the second comparator input. The comparator output may comprise the output signal delivered to the gate driver circuit 136.

Power control circuit 120 may, in some examples, include a first signal ramp unit and a second signal ramp unit. In some examples, the first signal ramp unit may represent the signal ramp unit that generates the second signal sum input for the signal sum unit. To cause the comparator to receive the first comparator input based on the control signal from the controller 110 and the power signal from the current sensor 126, the power control circuit 120 is configured to generate, using the first signal ramp unit, a first sequence of ramp signal pulses corresponding to the sequence of control signal pulses occurring at the control signal frequency. The power control circuit 120 is configured to generate the first comparator input based on the first sequence of ramp signal pulses and the power signal from the current sensor 126. To cause the comparator to receive the second comparator input based on the control signal from the controller 110, the power control circuit 120 is configured to generate, using the second signal ramp unit, the second comparator input to include a second sequence of ramp signal pulses corresponding to the sequence of control signal pulses occurring at the control signal frequency.

Control circuitry 111 of controller 110 may, in some examples, generate the control signal for output to power control circuit 120 based on a feedback signal received from node 144. For example, control circuitry 111 may receive a feedback signal from node 144 indicating a current at node 144, a voltage at node 144, a magnetic field corresponding to an electrical signal at node 144, or any combination thereof. This means that system 100 may represent a closed-loop system. In some examples, the feedback signal may represent an analog signal. In some examples, the control signal output by controller 110 to power control circuit 120 may represent an analog signal, but this is not required. In some examples, the control signal output by controller 110 to power control circuit 120 may represent a modulated digital signal.

By controlling the power to load 134 based on a single control signal received from controller 110 and a power signal received from current sensor 126, power control circuit 120 may control the power to load 134 more efficiently and with fewer circuit components as compared with systems that rely on a controller to process a control signal and a power signal. In other words, the power control circuit 120 may efficiently control power transistor(s) 138 to sink current when necessary and allow current to reach load 134, when necessary, in a way that does not require complex processing at controller 110 to process the power signal from current sensor 126 and the control signal generated by controller 110 based on a feedback signal.

Figure 2:
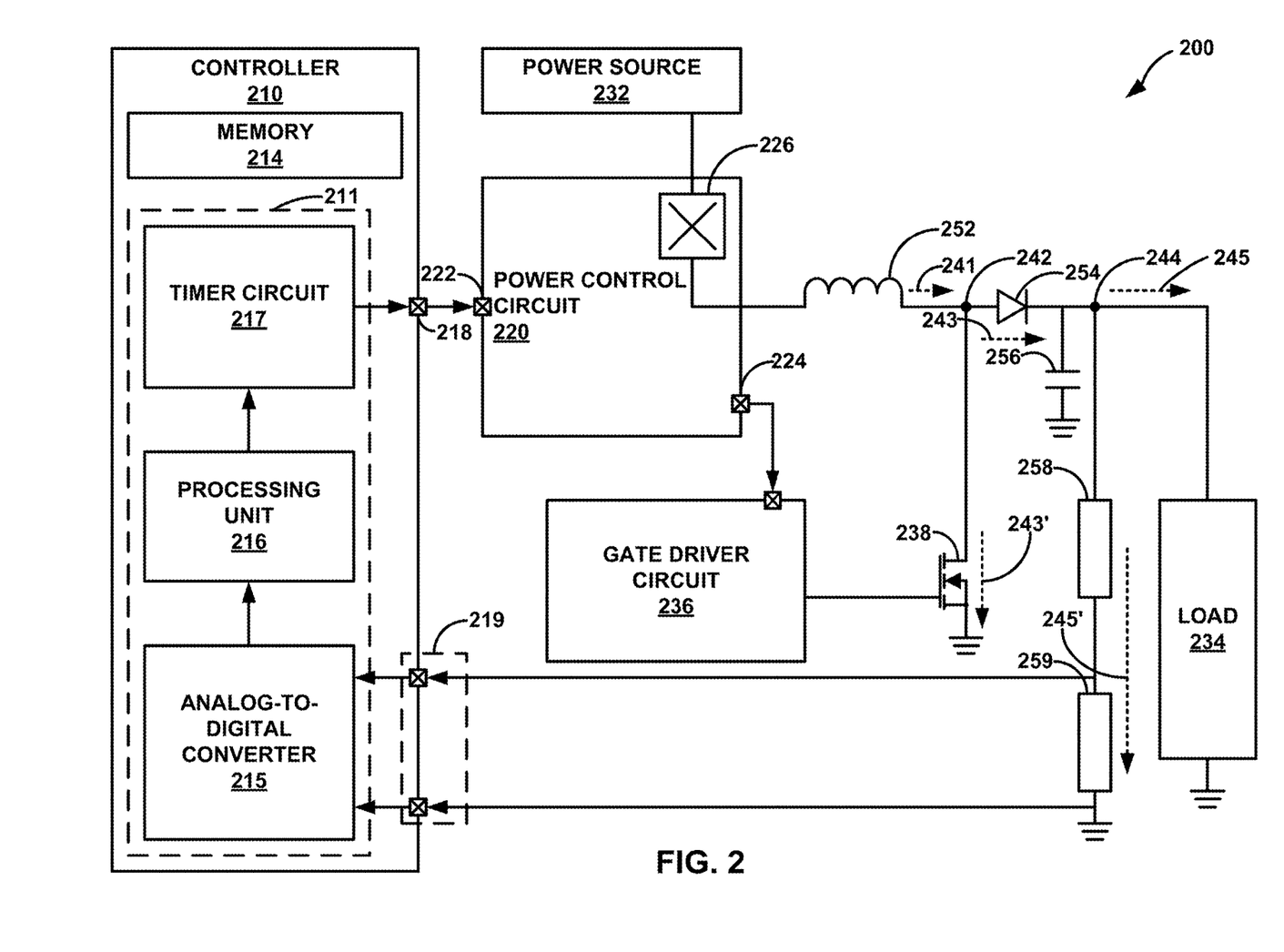
FIG. 2 is a circuit diagram illustrating a system including a power control circuit for controlling power delivered from a power source to a load, in accordance with this disclosure.

FIG. 2 is a circuit diagram illustrating a system 200 including a power control circuit 220 for controlling power delivered from a power source 232 to a load 234, in accordance with this disclosure. As seen in FIG. 2, system 200 includes controller 210 comprising control circuitry 211, memory 214, output connection 218, and input connections 219. Control circuitry 211 may include ADC 215, processing unit 216, and timer circuit 217. ADC 215, processing unit 216, and timer circuit 217 may be part of processing circuitry of control circuitry 211. System 200 also includes power control circuit 220 including input connection 222 and output connection 224. System 200 includes power source 232, load 234, gate driver circuit 236, power transistor 238, inductor 252, diode 254, capacitor 256, first resistor 258, and second resistor 259.

Controller 210 may be an example of controller 110 of FIG. 1. Control circuitry 211 may be an example of control circuitry 111 of FIG. 1. Memory 214 may be an example of memory 114 of FIG. 1. Power control circuit 220 may be an example of power control circuit 120 of FIG. 1. Input connection 222 may be an example of input connection 122 of FIG. 1. Output connection 224 may be an example of output connection 124 of FIG. 1. Current sensor 226 may be an example of current sensor 126 of FIG. 1. Power source 232 may be an example of power source 132 of FIG. 1. Load 234 may be an example of load 134 of FIG. 1. Gate driver circuit 236 may be an example of gate driver circuit 136 of FIG. 1. Power transistor 238 may be an example of power transistor(s) 138 of FIG. 1.

Controller 210 may include control circuitry 211. Control circuitry 211 may, in some examples, be configured to control power control circuit 220 to manage power delivered to load 234 by controlling power transistor 238. Control circuitry 211 may be configured to generate a control signal output via output connection 218 based on a feedback signal received via input connections 219. This means that control circuitry 211 may be part of a closed-loop system for controlling power delivered from power source 232 to load 234. For example, control circuitry 211 may be configured to output a control signal via output connection 218 of controller 210 to power control circuit 220 to cause power control circuit 220 to control gate driver circuit 236 to manage power transistor 238. Whether power transistor 238 is turned on or turned off may control an amount of power that reaches load 234.

Processing circuitry of control circuitry 211 may include, for example, one or more microprocessors, DSPs, ASICs, FPGAs, or equivalent discrete or integrated logic circuitry, or a combination of any of the foregoing devices or circuitry. Accordingly, processing circuitry of control circuitry 211 may include any suitable structure, whether in hardware, software, firmware, or any combination thereof, to perform the functions ascribed herein to controller 210.

Controller 210 may include a memory 214 in communication with the processing circuitry of control circuitry 211. In some examples, the memory 214 in communication with processing circuitry of control circuitry 211 includes computer-readable instructions that, when executed by the processing circuitry of control circuitry 211, cause system 200 to perform various functions attributed to system 200 herein. The memory 214 may include any volatile, non-volatile, magnetic, optical, or electrical media, such as a RAM, ROM, NVRAM, EEPROM, flash memory, or any other digital media capable of storing information.

Control circuitry 211 may include ADC 215. An ADC may convert a continuous analog signal to a sequence of discrete digital values for processing by digital devices such as microcontrollers, computers, or digital signal processors. For example, an analog signal may comprise a voltage signal that varies continuously over time. To convert the voltage signal into a digital signal, ADC 215 may sample the voltage signal at regular intervals. This may involve taking discrete samples of the continuous analog voltage signal at specific time intervals (e.g., every second, every millisecond (ms), every microsecond (μs), or any other interval).

In response to sampling values of the analog signal, ADC 215 may perform quantization. Quantization may involve mapping each of the sampled analog values to a corresponding discrete digital value. These digital values may represent binary values (0s and 1s) and indicate the magnitude of the analog signal at each sample point. ADC 215 may encode the quantized digital values are then into a binary number format, represented as a binary code. Example encoding schemes include binary code, Gray code, and two's complement. The final output of ADC 215 is a digital representation of the input analog signal. The digital representation of the input analog is digital data that may be processed, stored, or used for various purposes in digital systems.

ADC 215 may receive a feedback signal via input connections 219 of controller 210. The feedback signal may represent an analog signal. In some examples, the analog signal may represent a voltage signal, but this is not required. In some examples, the analog signal may represent a current signal or another type of signal that can indicate power. ADC 215 may generate a digital representation of the analog signal for output to processing unit 216. Processing unit 216 may include a PPU and/or a CPU that is configured to process a digital signal output by ADC 215. Since the digital signal output by ADC 215 may comprise a digital representation of the analog feedback signal received via input connections 219, processing unit 216 may generate a digital response to the feedback signal for output to timer circuit 217.

Timer circuit 217 may generate, based on the output from processing unit 216, a control signal for output to power control circuit 220 via output connection 218 of controller 210 and input connection 222 of power control circuit 220. Timer circuit 217 may generate the control signal to include a PWM signal for controlling power transistor 238. The PWM signal may include a sequence of pulses at a frequency. The PWM signal output from timer circuit 217 may control whether power transistor 238 is turned on or turned off, which may in turn control power delivered to load 234. For example, when power transistor 238 is turned on, a smaller amount of power may reach load 234 and when power transistor 238 is tuned off, a greater amount of power may reach load 234.

Power source 232 may be configured to deliver power to load 234 via current sensor 226 of power control circuit 220. Power control circuit 220 may receive the control signal from timer circuit 217 via input connection 222 of power control circuit 220. Power control circuit 220 may receive a power signal from current sensor 226 that indicates one or more parameters of an electrical signal output from power source 232 to load 234. For example, the power signal may indicate a current of the electrical signal, a voltage of the electrical signal, a magnetic field associated with the electrical signal, or any combination thereof. Based on the control signal received from controller 210 and the power signal generated by current sensor 226, power control circuit 220 may generate an output signal and transmit the output signal to gate driver circuit 236 via output connection 224.

Gate driver circuit 236 may receive the output signal from power control circuit 220 and control, based on the output signal, power transistor 238. In some examples, the output signal that gate driver circuit 236 receives from power control circuit 220 may include a sequence of pulses. The sequence of pulses may instruct gate driver circuit 236 to turn on and turn off power transistor 238 according to a sequence of switching cycles. In some examples, the sequence of switching cycles may include a sequence of on cycles and a sequence of off cycles interleaved with the sequence of on cycles.

When power transistor 238 is turned off, electrical current 241 may pass through node 242 as electrical current 243 without a portion of electrical current 241 flowing through power transistor 238 as electrical current 243'. This is because when power transistor 238 is turned off, a current pathway might not exist across power transistor 238 so electrical current cannot cross power transistor 238 when power transistor 238 is turned off. When power transistor 238 is turned on, electrical current 241 may split into electrical current 243 and electrical current 243' at node 242. Electrical current 243 may flow across diode 254 towards load 234 and electrical current 243' may flow through power transistor 238 without flowing to load 234. This means that when power transistor 238 is turned on, a portion of electrical current 241 may "sink" away from load 234 through power transistor 238 as electrical current 243'.

Inductor 252 represents an electrical circuit component that resists change in a magnitude of electrical current passing through inductor 252. In some examples, inductor 252 is defined by an electrically conductive wire that is wrapped in a coil. As electrical current passes through the coil of inductor 252, a magnetic field is created in the coil, and the magnetic field induces a voltage across the inductor. Inductor 252 defines an inductance value, and the inductance value is the ratio of the voltage across inductor 252 to the rate of change of current passing through inductor 252.

Diode 254 may represent a semiconductor device that operates as a diode. In the field of circuit electronics, diodes include semiconductor components which allow current to flow across the diode in a first direction (e.g., "forward direction") and prevent current from flowing across the diode in a second direction (e.g., "reverse direction"). A diode may include an anode and a cathode, and current may be able to pass through the diode in the forward direction from the anode to the cathode. However, current may be unable to pass through the diode in the reverse direction from the cathode to the anode. For example, current may flow across diode 254 in the forward direction from node 242 towards node 244.

Capacitor 256 is an electrical circuit component configured for storing electric potential energy. Capacitor 256 may, in some examples, occupy a "charged" state, where capacitor 256 stores a maximum amount of electric potential energy. Additionally, capacitor 256 may occupy a "discharged" state where capacitor 256 stores little or no electric potential energy. Capacitor 256 may also transition between the charged state and the discharged state. When capacitor 256 is charging, a current flows across capacitor 256, increasing the electric potential energy stored by capacitor 256. When capacitor 256 is discharging, the electric potential energy stored by capacitor 256 is released, causing capacitor 256 to emit an electric current.

First resistor 258 and second resistor 259 may, in some examples, be connected in series to node 244. In some examples, a portion of the electrical current 243 output from node 242 may flow across node 244 to load 234 as electrical current 245. In some examples, a portion of the electrical current 243 output from node 242 may flow to across first resistor 258 and second resistor 259 as electrical current 245'. In some examples, a magnitude of electrical current 245 is larger than electrical current 245'. In some examples, first resistor 258 and/or second resistor 259 may represent a sensor for generating a feedback signal indicating one or more parameters at node 244 (e.g., a voltage at node 244, a current at node 244, or another parameter of an electrical signal at node 244). For example, a feedback signal may travel from second resistor 259 to controller 210 via input connections 219 of controller 210.

System 200 may include a closed-loop feedback system. For example, control circuitry 211 may generate a control signal for output to power control circuit 220 based on a feedback signal received via input connections 219 of controller 210. Power control circuit 220 may generate an output signal to control gate driver circuit 236 to control power transistor 238 to manage the power delivered by power source 232 to load 234. This means that power control circuit 220 may control the electrical signal at node 244 based on the control signal received from controller 210. Controller 210 may receive the feedback signal indicating one or more parameters of the electrical signal at node 244 and generate the control signal based on the feedback signal, thus completing the closed-loop system.

Figure 3:
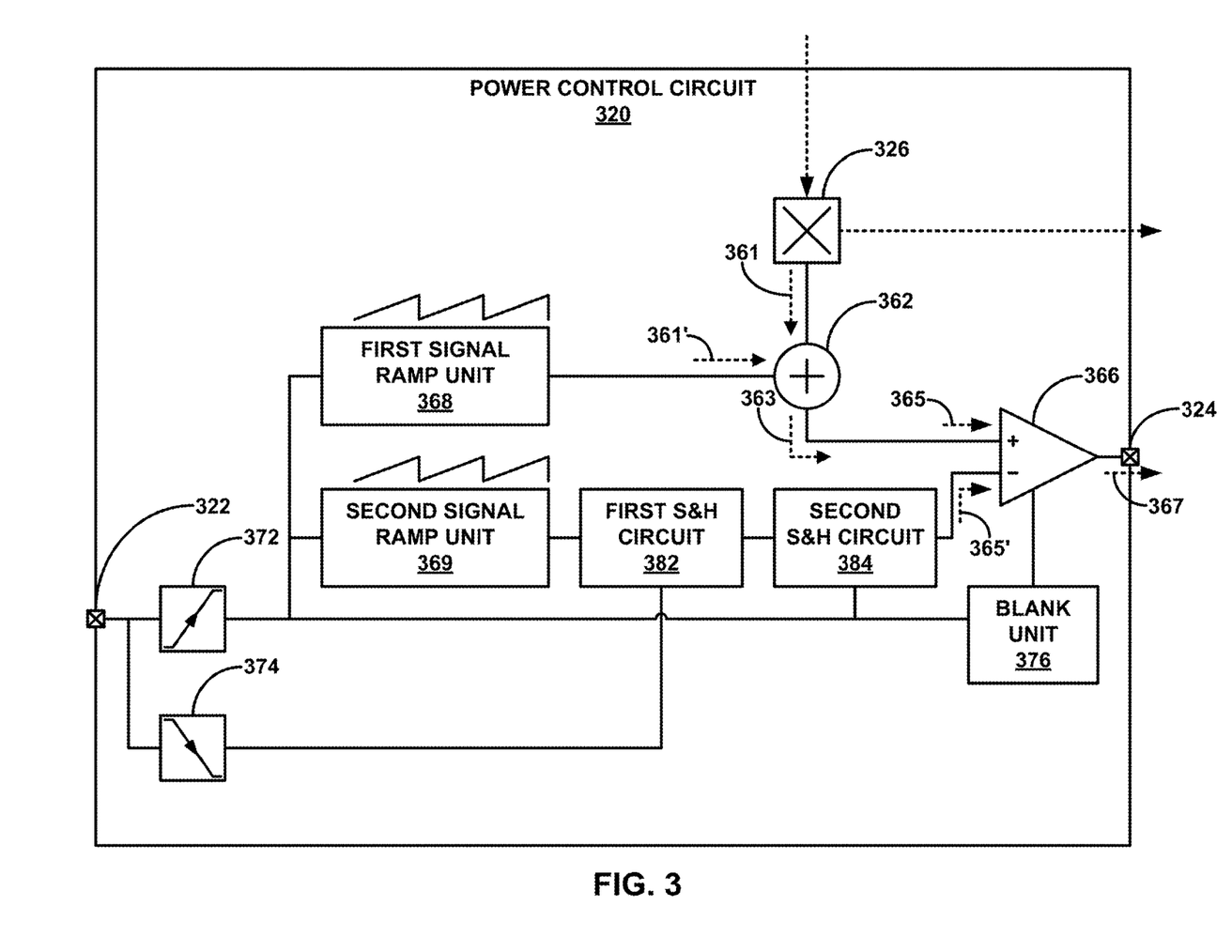
FIG. 3 is a circuit diagram illustrating an example configuration of a power control circuit, in accordance with this disclosure.

FIG. 3 is a circuit diagram illustrating an example configuration of a power control circuit 320, in accordance with this disclosure. As seen in FIG. 3, power control circuit 320 includes input connection 322, output connection 324, current sensor 326, a signal sum unit 362, a comparator 366, a first signal ramp unit 368, a second signal ramp unit 369, first voltage unit 372, second voltage unit 374, blank unit 376, first sample and hold (S&H) circuit 382, and second S&H circuit 384. Power control circuit 320 may be an example of power control circuit 120 of FIG. 1. Input connection 322 may be an example of input connection 122 of FIG. 1. Output connection 324 may be an example of output connection 124 of FIG. 1. Current sensor 326 may be an example of current sensor 126 of FIG. 1.

Power control circuit 320 may receive, via input connection 322, a control signal from controller 110. In some examples, the control signal may represent a PWM signal. The control signal may, in some examples, represent an analog signal, but this is not required. In some examples when the control signal is a PWM signal, the control signal may represent a modulated digital signal. Current sensor 326 of power control circuit 320 may generate a power signal that indicates one or more parameters of an electrical signal (e.g., the electrical signal output from power source 132). For example, the power signal may indicate a current, a voltage, and/or another parameter of the electrical signal.

Signal sum unit 362 may, in some examples, receive a first signal sum input 361 based on the power signal from current sensor 326 and receive a second signal sum input 361' based on the control signal received from the controller 110 via input connection 322. In some examples, signal sum unit 362 may generate a signal sum output 363 based on the first signal sum input 361 and the second signal sum input 361'. The signal sum output 363 may represent a sum of the first signal sum input 361 and the second signal sum input 361'.

In some examples, signal sum unit 362 may represent an analog signal summing unit, and first signal sum input 361 and second signal sum input 361' may represent analog signals. An analog signal summing unit may include a circuit that combines multiple analog signals into a single output signal. Signal sum unit 362 may sum the voltages of input signals to produce a resultant output voltage. For example, signal sum unit 362 may accept first signal sum input 361 and second signal sum input 361' as inputs. In some examples, each input signal may travel to a respective input resistor of signal sum unit 362. The values of input resistors may determine a weighting of each input signal in the final output. In a signal sum unit where input signals have equal weighting, the input resistors have the same resistance value, but resistance values may vary for different weighting schemes.

In some examples, signal sum unit 362 may include a summing amplifier for performing an addition operation. A summing amplifier may employ an operational amplifier in an inverting configuration. Input resistors of signal sum unit 362 may be connected to an inverting terminal of the summing amplifier. The inverting terminal may, in some examples, be connected to a feedback resistor which provides negative feedback. An output of the summing amplifier may be connected to the inverting terminal through the feedback resistor. The summing amplifier of signal sum unit 362 may transmit signal sum output 363 via an output terminal of the summing amplifier. Signal sum output 363 may represent an algebraic sum of the input voltages of first signal sum input 361 and second signal sum input 361', weighted by resistor values of the input resistors of signal sum unit 362.

Comparator 366 may comprise an electronic circuit that compares first comparator input 365 and second comparator input 365' and produces a comparator output 367 based on the comparison. One example function of comparator 366 is to determine which of the first comparator input 365 and second comparator input 365' is greater. Another example function of comparator 366 is to determine whether one of first comparator input 365 and second comparator input 365' is higher or lower than a reference voltage. Comparator 366 may include an inverting input (−) and a non-inverting input (+). As seen in FIG. 3, first comparator input 365 travels to the non-inverting input and second comparator input 365' travels to the inverting input.

In some examples, the inverting input is a terminal that receives an input signal for comparing against another value. In some examples, the non-inverting input is a terminal that receives an input signal for comparing against another value or a reference voltage against which the input to the inverting input. When a voltage at the non-inverting input (+) (e.g., a voltage of first comparator input 365) of comparator 366 is greater than the voltage at the inverting input (−) (e.g., a voltage of second comparator input 365') of comparator 366, an output from comparator 366 may be a high voltage. When a voltage at the inverting input (−) (e.g., a voltage of second comparator input 365') of comparator 366 is greater than a voltage at the non-inverting input (+) (e.g., a voltage of first comparator input 365) of comparator 366, an output from comparator 366 may be a low voltage.

Power control circuit 320 may cause comparator 366 to receive first comparator input 365 based on a control signal received from the controller 110 via input connection 122 and a power signal received from current sensor 126. In some examples, first comparator input 365 is substantially equivalent to signal sum output 363. Since first comparator input 365 is based on both the control signal from controller 110 and the power signal from current sensor 326, comparator 366 may be configured to generate an output based on both the control signal from controller 110 and the power signal from current sensor 326. Power control circuit 320 may cause comparator 366 to receive second comparator input 365' that is based on the control signal received from controller 110 via input connection 322. Comparator 366 may generate a comparator output 367 based on the first comparator input 365 and the second comparator input 365'. The comparator output may represent the output signal delivered to gate driver circuit 136 via output connection 324.

In some examples, in response to first comparator input 365 being greater than second comparator input 365', comparator 366 generates comparator output 367 to include a high voltage that causes gate driver circuit 136 to turn on power transistor(s) 138. In some examples, in response to first comparator input 365 being not greater than second comparator input 365', comparator 366 generates comparator output 367 to include a low voltage that causes gate driver circuit 136 to turn on power transistor(s) 138. Since first comparator input 365 is at least partially based on the power signal from current sensor 326, this means that comparator 366 may turn on power transistor(s) 138 in response to a current across current sensor 326 being high and turn off power transistor(s) 138 in response to a current across current sensor 326 being low.

For example, in response to a current across current sensor 326 being high, the closed-loop system including power control circuit 320 may turn on power transistor(s) 138 to sink a portion of the current output from power source 132 across power transistor(s) 138. In response to a current across current sensor 326 being low, the closed-loop system including power control circuit 320 may turn off power transistor(s) 138 so that the current output from power source 132 reaches load 134 without a portion of the current sinking across power transistor(s) 138. Comparator 366 may generate the comparator output 367 to control whether gate driver circuit 136 turns on or turns off power transistor(s) 138.

Power control circuit 320 may process the control signal received from controller 110 via input connection 322 for input to signal sum unit 362 and comparator 366. In some examples, the control signal received from controller 110 via input connection 322 may represent a modulated digital signal comprising a sequence of square waves at a pulse frequency. First voltage unit 372 and second voltage unit 374 may process the control signal received from controller 110 via input connection 322. In some examples, first voltage unit 372 may generate an output for delivery to first signal ramp unit 368 and second signal ramp unit 369. In some examples, second voltage unit 374 may generate an output for delivery to first S&H circuit 382.

In some examples, first signal ramp unit 368 may generate a first sequence of ramp pulses based on the control signal received from controller 110 via input connection 322. In some examples, to cause comparator 366 to receive the first comparator input 365 based on the control signal from controller 110 and the power signal from current sensor 326, power control circuit 320 is configured to generate, using first signal ramp unit 368, a first sequence of ramp signal pulses corresponding to a sequence of control signal pulses occurring at a control signal frequency. For example, the control signal may comprise the sequence of control signal pulses occurring at the control signal frequency. First signal ramp unit 368 may generate the second signal sum input 361' to include the first sequence of ramp signal pulses so that signal sum unit 362 generates signal sum output 363 based on the first signal sum input 361 and second signal sum input 361'.

To generate a ramp signal from a sequence of square waves, first signal ramp unit 368 may use a circuit that integrates the square wave input to create a linear voltage ramp. This integration process may involve accumulating a charge over time, resulting in a ramping voltage. For example, a square wave may alternate between two voltage levels (e.g., a high voltage and a low voltage) at a pulse frequency. First signal ramp unit 368 may include an integrator comprising an operational amplifier and a capacitor. The integrator may generate an output comprising a voltage that is proportional to an integral of an input voltage over time. When the input to first signal ramp unit 368 is a high voltage (e.g., during each of the sequence of square pulses), the integrator of first signal ramp unit 368 may charge the capacitor at a constant rate. This may result in a linear increase in voltage across the capacitor. When the input to first signal ramp unit 368 is a low voltage (e.g., between consecutive square pulses of the sequence of square pulses), the capacitor may discharge through a resistor, causing the voltage to decrease.

Second signal ramp unit 369 may be substantially the same as first signal ramp unit 368, except that second signal ramp unit 369 generates an output for delivery to first S&H circuit 382 whereas first signal ramp unit 368 generates an output for delivery to signal sum unit 362. In some examples, to cause comparator 366 to receive a second comparator input based on the control signal from controller 110, power control circuit 320 is configured to generate, using second signal ramp unit 369, an output to include a second sequence of ramp signal pulses corresponding to the sequence of control signal pulses of the control signal occurring at the control signal frequency. In some examples, the second sequence of ramp signal pulses output from second signal ramp unit 369 may be further processed by first S&H circuit 382 and second S&H circuit 384 to generate second comparator input 365'.

First S&H circuit 382 may capture and store a signal at a specific moment in time, making it available as a constant voltage for further processing or conversion. For example, first S&H circuit 382 may sample an incoming analog signal. A sampling switch, often controlled by a clock signal or a trigger, may be used to connect the input signal to a storage capacitor. The input signal may be connected to the capacitor during the sampling phase. The storage capacitor may charge to a voltage level of the input signal. This may allow first S&H circuit to capture a snapshot of a voltage of the input signal at a particular moment. In some examples, after a sampling phase, first S&H circuit 382 may open a sampling switch, disconnecting an input signal from the storage capacitor. First S&H circuit 382 may close a holding switch, connecting the capacitor to an output of the first S&H circuit. A buffer amplifier may, in some examples, be placed between a storage capacitor and an output. The buffer may maintain sampled voltage and decrease a load on the storage capacitor, ensuring that the voltage remains relatively constant during the holding phase.

Second S&H circuit 384 may be substantially the same as first S&H circuit, except that second S&H circuit 384 receives inputs from first voltage unit 372 and first S&H circuit 382, whereas first S&H circuit 382 receives inputs from second voltage unit 374 and second signal ramp unit 369. Blank unit 376 may receive an input from first voltage unit 372 and generate an output to comparator 366.

Figure 4:
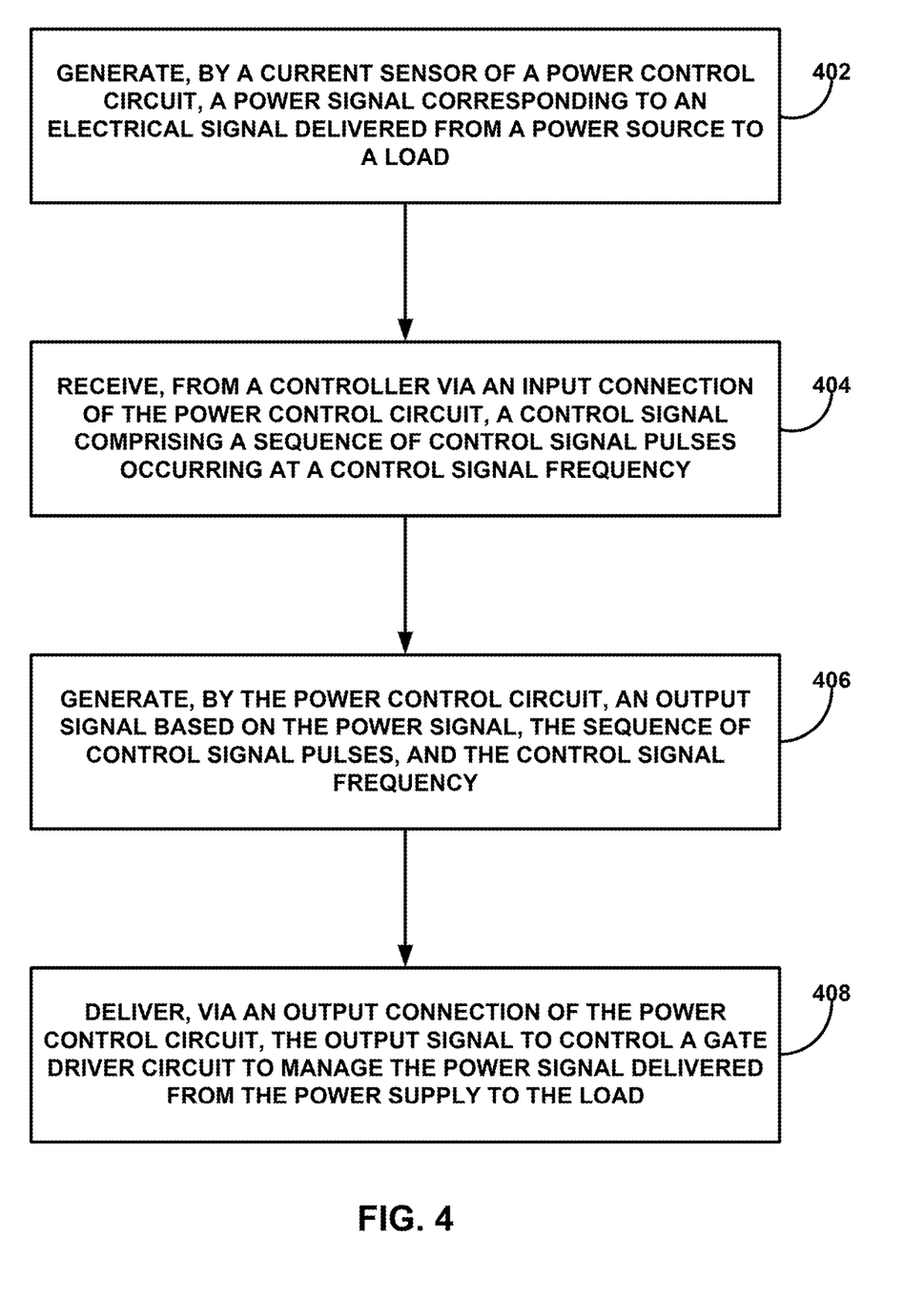
FIG. 4 is a flow diagram illustrating an example operation for using a power control circuit to control power to a load based on a control signal and a power signal, in accordance with one or more techniques of this disclosure.

FIG. 4 is a flow diagram illustrating an example operation for using a power control circuit to control power to a load based on a control signal and a power signal, in accordance with one or more techniques of this disclosure. FIG. 4 is described with respect to system 100 of FIG. 1. However, the techniques of FIG. 4 may be performed by different components of system 100 or by additional or alternative systems.

Power control circuit 120 may generate, using current sensor 126, a power signal corresponding to an electrical signal delivered from power source 132 to load 134 (402). For example, the power source 132 may deliver an electrical signal to load 134, the electrical signal passing through current sensor 126 of power control circuit 120. In some examples, the electrical signal includes a current and a voltage. In some examples, a magnetic field is associated with the electrical signal. It may be beneficial for power control circuit 120 to control power delivered to load 134 based on the power signal generated by current sensor 126. For example, it may be beneficial to prevent the current and/or the voltage at load 134 from exceeding a high threshold or falling below a low threshold.

Power control circuit 120 may receive, from controller 110 via input connection 122 of power control circuit 120, a control signal comprising a sequence of control signal pulses occurring at a control signal frequency (404). In some examples, the sequence of control signal pulses may include a sequence of square pulses. In some examples, the control signal may represent a digital PWM signal. The control signal frequency may, in some examples, represent a frequency for controlling power transistor(s) 138. That is, power control circuit 120 may control power transistor(s) 138 in part based on the control signal including the sequence of control signal pulses at the control signal frequency.

Power control circuit 120 may generate an output signal based on the power signal, the sequence of control signal pulses, and the control signal frequency (406). For example, power control circuit 120 may generate the output signal based on the power signal and the control signal. For example, the control signal may include a frequency for controlling power transistor(s) 138. The power signal may indicate a need for sinking power away from load 134. For example, when the power signal indicates a higher current, it may be beneficial to control power transistor(s) 138 to sink current away from load 134 and when the power signal indicates a lower current, it may be beneficial to control power transistor(s) 138 not to sink current away from load 134. Power control circuit 120 may deliver, via output connection 124 of power control circuit 120, the output signal to control gate driver circuit 136 to manage the power signal delivered from the power source 132 to the load 134 (408).

The following numbered clauses may demonstrate one or more aspects of the disclosure.

Clause 1: A power control circuit includes an input connection, an output connection, and a current sensor configured to generate a power signal corresponding to an electrical signal delivered from a power source to a load. The power control circuit is configured to receive, from a controller via the input connection, a control signal comprising a sequence of control signal pulses occurring at a control signal frequency and generate an output signal based on the power signal, the sequence of control signal pulses, and the control signal frequency. The power control circuit is configured to deliver, via the output connection, the output signal to control a gate driver circuit to manage the power signal delivered from the power source to the load.

Clause 2: The power control circuit of clause 1, wherein to generate the output signal, the power control circuit is configured to generate the output signal to include a sequence of gate control pulses, wherein each gate control pulse of the sequence of gate control pulses is configured to cause a power transistor to turn on and turn off according to a power transistor switching cycle, and wherein to deliver the output signal, the power control circuit is configured to deliver the output signal to the gate driver circuit so that the gate driver circuit controls a gate terminal of the power transistor so that the power transistor turns off and turns on according to the sequence of gate control pulses.

Clause 3: The power control circuit of clause 2, wherein the power transistor is connected to a node located between the power source and the load so that when the power control circuit delivers the output signal to the gate driver circuit to control the power transistor, the power control circuit is configured to: cause at least a portion of the power signal to flow through the power transistor in response to the power transistor being turned on; and cause the power signal to flow from the power source to the load without flowing through the power transistor in response to the power transistor being turned off.

Clause 4: The power control circuit of any of clauses 1-3, wherein the power control circuit further comprises a signal sum unit, and wherein the power control circuit is further configured to: cause the signal sum unit to receive a first signal sum input based on the power signal from the current sensor; cause the signal sum unit to receive a second signal sum input based on the control signal from the input connection; generate, using the signal sum unit, a signal sum output based on the first signal sum input and the second signal sum input, wherein the signal sum output comprises a sum of the first signal sum input and the second signal sum input; and generate the output signal based on the signal sum output.

Clause 5: The power control circuit of clause 4, wherein the power control circuit further comprises a signal ramp unit, and wherein the power control circuit is further configured to generate, using the signal ramp unit, the second signal sum input based on the control signal from the input connection, wherein the second signal sum input comprises a sequence of ramp signal pulses corresponding to the sequence of control signal pulses occurring at the control signal frequency.

Clause 6: The power control circuit of any of clauses 1-5, wherein the power control circuit further comprises a comparator, and wherein to generate the output signal, the power control circuit is configured to: cause the comparator to receive a first comparator input based on the control signal from the controller and the power signal from the current sensor; cause the comparator to receive a second comparator input based on the control signal from the controller; and generate, using the comparator, a comparator output based on the first comparator input and the second comparator input, wherein the comparator output comprises the output signal delivered to the gate driver circuit.

Clause 7: The power control circuit of clause 6, wherein the power control circuit further comprises a first signal ramp unit and a second signal ramp unit, wherein to cause the comparator to receive the first comparator input based on the control signal from the controller and the power signal from the current sensor, the power control circuit is configured to: generate, using the first signal ramp unit, a first sequence of ramp signal pulses corresponding to the sequence of control signal pulses occurring at the control signal frequency; and generate the first comparator input based on the first sequence of ramp signal pulses and the power signal from the current sensor, and wherein to cause the comparator to receive the second comparator input based on the control signal from the controller, the power control circuit is configured to generate, using the second signal ramp unit, the second comparator input to include a second sequence of ramp signal pulses corresponding to the sequence of control signal pulses occurring at the control signal frequency.

Clause 8: The power control circuit of any of clauses 1-7, wherein the control signal comprises an analog control signal, wherein by delivering the output signal to the gate driver circuit to control the power signal delivered from the power source to the load, the power control circuit is configured to cause the controller to receive an analog feedback signal, wherein the analog feedback signal indicates one or more parameters of the power signal delivered from the power source to the load, and wherein the analog control signal is based on the analog feedback signal.

Clause 9: The power control circuit of any of clauses 1-8, wherein the control signal comprises a modulated digital signal.

Clause 10: The power control circuit of any of clauses 1-9, wherein to deliver the output signal to control the gate driver circuit to manage the power signal, the power control circuit is configured to deliver the output signal to the gate driver circuit.

Clause 11: The power control circuit of any of clauses 1-10, wherein to deliver the output signal to control the gate driver circuit to manage the power signal, the power control circuit is configured to deliver the output signal to the controller, causing the controller to control the gate driver circuit to manage the power signal.

Clause 12: The power control circuit of any of clauses 1-11, wherein the current sensor comprises a Hall effect sensor configured to sense a magnetic field corresponding to a current of the power signal.

Clause 13: A method includes generating, by a current sensor of a power control circuit, a power signal corresponding to an electrical signal delivered from a power source to a load and receiving, by a power control circuit from a controller via an input connection of the power control circuit, a control signal comprising a sequence of control signal pulses occurring at a control signal frequency. The method also includes generating, by the power control circuit, an output signal based on the power signal, the sequence of control signal pulses, and the control signal frequency and delivering, by the power control circuit via an output connection, the output signal to control a gate driver circuit to manage the power signal delivered from the power source to the load.

Clause 14: The method of clause 13, wherein generating the output signal comprises generating, by the power control circuit, the output signal to include a sequence of gate control pulses, wherein each gate control pulse of the sequence of gate control pulses is configured to cause a power transistor to turn on and turn off according to a power transistor switching cycle, and wherein delivering the output signal comprises delivering, by the power control circuit, the output signal to the gate driver circuit so that the gate driver circuit controls a gate terminal of the power transistor so that the power transistor turns off and turns on according to the sequence of gate control pulses.

Clause 15: The method of clause 14, wherein the power transistor is connected to a node located between the power source and the load so that when the power control circuit delivers the output signal to the gate driver circuit to control the power transistor, the method comprises: causing, by the power control circuit, at least a portion of the power signal to flow through the power transistor in response to the power transistor being turned on; and causing, by the power control circuit, the power signal to flow from the power source to the load without flowing through the power transistor in response to the power transistor being turned off.

Clause 16: The method of any of clauses 13-15, wherein the power control circuit further comprises a signal sum unit, and wherein the method further comprises: causing, by the power control circuit, the signal sum unit to receive a first signal sum input based on the power signal from the current sensor; causing, by the power control circuit, the signal sum unit to receive a second signal sum input based on the control signal from the input connection; generating, by the power control circuit using the signal sum unit, a signal sum output based on the first signal sum input and the second signal sum input, wherein the signal sum output comprises a sum of the first signal sum input and the second signal sum input; and generating, by the power control circuit, the output signal based on the signal sum output.

Clause 17: The method of clause 16, wherein the power control circuit further comprises a signal ramp unit, and wherein the method further comprises generating, by the power control circuit using the signal ramp unit, the second signal sum input based on the control signal from the input connection, wherein the second signal sum input comprises a sequence of ramp signal pulses corresponding to the sequence of control signal pulses occurring at the control signal frequency.

Clause 18: The method of any of clauses 13-17, wherein the power control circuit further comprises a comparator, and wherein generating the output signal comprises: causing, by the power control circuit, the comparator to receive a first comparator input based on the control signal from the controller and the power signal from the current sensor; causing, by the power control circuit, the comparator to receive a second comparator input based on the control signal from the controller; and generating, by the power control circuit using the comparator, a comparator output based on the first comparator input and the second comparator input, wherein the comparator output comprises the output signal delivered to the gate driver circuit.

Clause 19: The method of clause 18, wherein the power control circuit further comprises a first signal ramp unit and a second signal ramp unit, wherein causing the comparator to receive the first comparator input based on the control signal from the controller and the power signal from the current sensor comprises: generating, by the power control circuit using the first signal ramp unit, a first sequence of ramp signal pulses corresponding to the sequence of control signal pulses occurring at the control signal frequency; and generating, by the power control circuit, the first comparator input based on the first sequence of ramp signal pulses and the power signal from the current sensor, and wherein causing the comparator to receive the second comparator input based on the control signal from the controller comprises generating, by the power control circuit using the second signal ramp unit, the second comparator input to include a second sequence of ramp signal pulses corresponding to the sequence of control signal pulses occurring at the control signal frequency.

Clause 20: A system includes a controller, a gate driver circuit, and a power control circuit. The power control circuit includes an input connection, an output connection, and a current sensor configured to generate a power signal corresponding to an electrical signal delivered from a power source to a load. The power control circuit is configured to receive, from the controller via the input connection, a control signal comprising a sequence of control signal pulses occurring at a control signal frequency, generate an output signal based on the power signal, the sequence of control signal pulses, and the control signal frequency, and deliver, via the output connection, the output signal to control the gate driver circuit to manage the power signal delivered from the power source to the load.

The techniques described in this disclosure may be implemented, at least in part, in hardware, software, firmware or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

The techniques described in this disclosure may also be embodied or encoded in a computer-readable medium, such as a computer-readable storage medium, containing instructions. Instructions embedded or encoded in a computer-readable storage medium may cause a programmable processor, or other processor, to perform the method, e.g., when the instructions are executed. Computer readable storage media may include RAM, ROM, programmable read only memory (PROM), erasable programmable read only memory (EPROM), EEPROM, flash memory, a hard disk, a compact disk-read only memory (CD-ROM), a floppy disk, a cassette, magnetic media, optical media, or other computer readable media.

Various examples have been described. These and other examples are within the scope of the following claims.

What is claimed is:

1. A power control circuit comprising:
an input connection;
an output connection; and
a current sensor configured to generate a power signal corresponding to an electrical signal delivered from a power source to a load,
wherein the power control circuit is configured to:
receive, from a controller via the input connection, a control signal comprising a sequence of control signal pulses occurring at a control signal frequency;
generate an output signal based on the power signal, the sequence of control signal pulses, and the control signal frequency; and
deliver, via the output connection, the output signal to control a gate driver circuit to manage the power signal delivered from the power source to the load,
wherein the power control circuit further comprises a signal sum unit, and wherein the power control circuit is further configured to:
cause the signal sum unit to receive a first signal sum input based on the power signal from the current sensor;
cause the signal sum unit to receive a second signal sum input based on the control signal from the input connection;
generate, using the signal sum unit, a signal sum output based on the first signal sum input and the second signal sum input, wherein the signal sum output comprises a sum of the first signal sum input and the second signal sum input; and
generate the output signal based on the signal sum output.

2. The power control circuit of claim 1,
wherein to generate the output signal, the power control circuit is configured to generate the output signal to include a sequence of gate control pulses, wherein each gate control pulse of the sequence of gate control pulses is configured to cause a power transistor to turn on and turn off according to a power transistor switching cycle, and
wherein to deliver the output signal, the power control circuit is configured to deliver the output signal to the gate driver circuit so that the gate driver circuit controls a gate terminal of the power transistor so that the power transistor turns off and turns on according to the sequence of gate control pulses.

3. The power control circuit of claim 2, wherein the power transistor is connected to a node located between the power source and the load so that when the power control circuit delivers the output signal to the gate driver circuit to control the power transistor, the power control circuit is configured to:

cause at least a portion of the power signal to flow through the power transistor in response to the power transistor being turned on; and cause the power signal to flow from the power source to the load without flowing through the power transistor in response to the power transistor being turned off.

4. The power control circuit of claim 1, wherein the power control circuit further comprises a signal ramp unit, and wherein the power control circuit is further configured to generate, using the signal ramp unit, the second signal sum input based on the control signal from the input connection, wherein the second signal sum input comprises a sequence of ramp signal pulses corresponding to the sequence of control signal pulses occurring at the control signal frequency.

5. The power control circuit of claim 1, wherein the power control circuit further comprises a comparator, and wherein to generate the output signal, the power control circuit is configured to:
cause the comparator to receive a first comparator input based on the control signal from the controller and the power signal from the current sensor;
cause the comparator to receive a second comparator input based on the control signal from the controller; and
generate, using the comparator, a comparator output based on the first comparator input and the second comparator input, wherein the comparator output comprises the output signal delivered to the gate driver circuit.

6. A power control circuit comprising:
an input connection;
an output connection; and
a current sensor configured to generate a power signal corresponding to an electrical signal delivered from a power source to a load,
wherein the power control circuit is configured to:
receive, from a controller via the input connection, a control signal comprising a sequence of control signal pulses occurring at a control signal frequency;
generate an output signal based on the power signal, the sequence of control signal pulses, and the control signal frequency; and
deliver, via the output connection, the output signal to control a gate driver circuit to manage the power signal delivered from the power source to the load,
wherein the power control circuit further comprises a comparator, and wherein to generate the output signal, the power control circuit is configured to:
cause the comparator to receive a first comparator input based on the control signal from the controller and the power signal from the current sensor;
cause the comparator to receive a second comparator input based on the control signal from the controller; and
generate, using the comparator, a comparator output based on the first comparator input and the second comparator input, wherein the comparator output comprises the output signal delivered to the gate driver circuit, and
wherein the power control circuit further comprises a first signal ramp unit and a second signal ramp unit,
wherein to cause the comparator to receive the first comparator input based on the control signal from the controller and the power signal from the current sensor, the power control circuit is configured to:
generate, using the first signal ramp unit, a first sequence of ramp signal pulses corresponding to the sequence of control signal pulses occurring at the control signal frequency; and
generate the first comparator input based on the first sequence of ramp signal pulses and the power signal from the current sensor, and
wherein to cause the comparator to receive the second comparator input based on the control signal from the controller, the power control circuit is configured to generate, using the second signal ramp unit, the second comparator input to include a second sequence of ramp signal pulses corresponding to the sequence of control signal pulses occurring at the control signal frequency.

7. The power control circuit of claim 1, wherein the control signal comprises an analog control signal,
wherein by delivering the output signal to the gate driver circuit to control the power signal delivered from the power source to the load, the power control circuit is configured to cause the controller to receive an analog feedback signal, wherein the analog feedback signal indicates one or more parameters of the power signal delivered from the power source to the load, and
wherein the analog control signal is based on the analog feedback signal.

8. The power control circuit of claim 1, wherein the control signal comprises a modulated digital signal.

9. The power control circuit of claim 1, wherein to deliver the output signal to control the gate driver circuit to manage the power signal, the power control circuit is configured to deliver the output signal to the gate driver circuit.

10. The power control circuit of claim 1, wherein to deliver the output signal to control the gate driver circuit to manage the power signal, the power control circuit is configured to deliver the output signal to the controller, causing the controller to control the gate driver circuit to manage the power signal.

11. The power control circuit of claim 1, wherein the current sensor comprises a Hall effect sensor configured to sense a magnetic field corresponding to a current of the power signal.

12. A method comprising:
generating, by a current sensor of a power control circuit, a power signal corresponding to an electrical signal delivered from a power source to a load;
receiving, by a power control circuit from a controller via an input connection of the power control circuit, a control signal comprising a sequence of control signal pulses occurring at a control signal frequency;
generating, by the power control circuit, an output signal based on the power signal, the sequence of control signal pulses, and the control signal frequency; and
delivering, by the power control circuit via an output connection, the output signal to control a gate driver circuit to manage the power signal delivered from the power source to the load,
wherein the power control circuit further comprises a signal sum unit, and wherein the method further comprises:
causing, by the power control circuit, the signal sum unit to receive a first signal sum input based on the power signal from the current sensor;
causing, by the power control circuit, the signal sum unit to receive a second signal sum input based on the control signal from the input connection;
generating, by the power control circuit using the signal sum unit, a signal sum output based on the first signal sum input and the second signal sum input, wherein the signal sum output comprises a sum of the first signal sum input and the second signal sum input; and generating, by the power control circuit, the output signal based on the signal sum output.

13. The method of claim 12,
wherein generating the output signal comprises generating, by the power control circuit, the output signal to include a sequence of gate control pulses, wherein each gate control pulse of the sequence of gate control pulses is configured to cause a power transistor to turn on and turn off according to a power transistor switching cycle, and
wherein delivering the output signal comprises delivering, by the power control circuit, the output signal to the gate driver circuit so that the gate driver circuit controls a gate terminal of the power transistor so that the power transistor turns off and turns on according to the sequence of gate control pulses.

14. The method of claim 13, wherein the power transistor is connected to a node located between the power source and the load so that when the power control circuit delivers the output signal to the gate driver circuit to control the power transistor, the method comprises:
causing, by the power control circuit, at least a portion of the power signal to flow through the power transistor in response to the power transistor being turned on; and
causing, by the power control circuit, the power signal to flow from the power source to the load without flowing through the power transistor in response to the power transistor being turned off.

15. The method of claim 12, wherein the power control circuit further comprises a signal ramp unit, and wherein the method further comprises generating, by the power control circuit using the signal ramp unit, the second signal sum input based on the control signal from the input connection, wherein the second signal sum input comprises a sequence of ramp signal pulses corresponding to the sequence of control signal pulses occurring at the control signal frequency.

16. The method of claim 12, wherein the power control circuit further comprises a comparator, and wherein generating the output signal comprises:
causing, by the power control circuit, the comparator to receive a first comparator input based on the control signal from the controller and the power signal from the current sensor;
causing, by the power control circuit, the comparator to receive a second comparator input based on the control signal from the controller; and
generating, by the power control circuit using the comparator, a comparator output based on the first comparator input and the second comparator input, wherein the comparator output comprises the output signal delivered to the gate driver circuit.

17. A method comprising:
generating, by a current sensor of a power control circuit, a power signal corresponding to an electrical signal delivered from a power source to a load;
receiving, by a power control circuit from a controller via an input connection of the power control circuit, a control signal comprising a sequence of control signal pulses occurring at a control signal frequency;
generating, by the power control circuit, an output signal based on the power signal, the sequence of control signal pulses, and the control signal frequency; and
delivering, by the power control circuit via an output connection, the output signal to control a gate driver circuit to manage the power signal delivered from the power source to the load, wherein the power control circuit further comprises a comparator, and wherein generating the output signal comprises:
causing, by the power control circuit, the comparator to receive a first comparator input based on the control signal from the controller and the power signal from the current sensor;
causing, by the power control circuit, the comparator to receive a second comparator input based on the control signal from the controller; and
generating, by the power control circuit using the comparator, a comparator output based on the first comparator input and the second comparator input, wherein the comparator output comprises the output signal delivered to the gate driver circuit, and
wherein the power control circuit further comprises a first signal ramp unit and a second signal ramp unit,
wherein causing the comparator to receive the first comparator input based on the control signal from the controller and the power signal from the current sensor comprises:
generating, by the power control circuit using the first signal ramp unit, a first sequence of ramp signal pulses corresponding to the sequence of control signal pulses occurring at the control signal frequency; and
generating, by the power control circuit, the first comparator input based on the first sequence of ramp signal pulses and the power signal from the current sensor, and
wherein causing the comparator to receive the second comparator input based on the control signal from the controller comprises generating, by the power control circuit using the second signal ramp unit, the second comparator input to include a second sequence of ramp signal pulses corresponding to the sequence of control signal pulses occurring at the control signal frequency.

18. A system comprising:
a controller;
a gate driver circuit; and
a power control circuit comprising:
an input connection;
an output connection; and
a current sensor configured to generate a power signal corresponding to an electrical signal delivered from a power source to a load,
wherein the power control circuit is configured to:
receive, from the controller via the input connection, a control signal comprising a sequence of control signal pulses occurring at a control signal frequency;
generate an output signal based on the power signal, the sequence of control signal pulses, and the control signal frequency; and
deliver, via the output connection, the output signal to control the gate driver circuit to manage the power signal delivered from the power source to the load
wherein the power control circuit further comprises a signal sum unit, and wherein the power control circuit is further configured to:
cause the signal sum unit to receive a first signal sum input based on the power signal from the current sensor;
cause the signal sum unit to receive a second signal sum input based on the control signal from the input connection;
generate, using the signal sum unit, a signal sum output based on the first signal sum input and the second signal sum input, wherein the signal sum output comprises a sum of the first signal sum input and the second signal sum input; and generate the output signal based on the signal sum output.

\* \* \* \* \*